(12) United States Patent  (10) Patent No.: US 7,541,539 B2
Le  (45) Date of Patent: Jun. 2, 2009

(54) WALL BOX MOUNTING APPARATUS

(75) Inventor: Phong Le, Lewisville, TX (US)

(73) Assignee: AMX LLC, Richardson, TX (US)

( * ) Notice: Subject to any disclaimer, the term of this patent is extended or adjusted under 35 U.S.C. 154(b) by 0 days.

(21) Appl. No.: 12/169,811

(22) Filed: Jul. 9, 2008

(65) Prior Publication Data

US 2008/0289845 A1 Nov. 27, 2008

Related U.S. Application Data

(63) Continuation of application No. 11/673,285, filed on Feb. 9, 2007, now Pat. No. 7,414,193.

(51) Int. Cl.
H02G 3/14 (2006.01)
(52) U.S. Cl. .............. 174/66; 174/67; 174/50; 174/58; 174/63; 220/241; 439/535
(58) Field of Classification Search ............ 174/50, 174/58, 63, 66, 67; 220/241, 242, 4.02, 3.8; 439/535, 538; 248/906; 200/304, 330; 307/139; 315/291; D8/353; D10/108, 116, 118; D13/162, D13/164, 169, 171
See application file for complete search history.

(56) References Cited

U.S. PATENT DOCUMENTS

| D285,066 | S | 8/1986 | Liss et al. |
| D294,566 | S | 3/1988 | Boytor |
| 5,015,829 | A | 5/1991 | Eilert et al. |
| D327,255 | S | 6/1992 | D'Aleo et al. |
| 5,237,327 | A | 8/1993 | Saitoh et al. |
| 5,458,311 | A | 10/1995 | Holbrook |
| D365,329 | S | 12/1995 | Seymour et al. |
| D378,814 | S | 4/1997 | Adams et al. |
| D380,737 | S | 7/1997 | Weir et al. |
| D381,590 | S | 7/1997 | Thoeni et al. |
| D390,211 | S | 2/1998 | Yates et al. |
| D400,539 | S | 11/1998 | Hippen |
| D404,391 | S | 1/1999 | Herbstritt et al. |
| D406,830 | S | 3/1999 | Herbstritt et al. |
| D413,867 | S | 9/1999 | Mullet et al. |
| D416,910 | S | 11/1999 | Vasquez |
| D423,508 | S | 4/2000 | Nakajima |
| 6,103,974 | A | 8/2000 | Erdfarb |
| 6,114,637 | A | 9/2000 | Nakao et al. |
| D449,789 | S | 10/2001 | Gunji et al. |

(Continued)

OTHER PUBLICATIONS

U.S. Appl. No. 29/270,392, filed Dec. 20, 2006, Dukerschein.

(Continued)

*Primary Examiner*—Dhiru R Patel
(74) *Attorney, Agent, or Firm*—Gardere Wynne Sewell LLP; Karl L. Larson

(57) ABSTRACT

An apparatus and method for mounting a device in a wall box is provided. The apparatus includes a base plate formed by a front portion and a plurality of side portions extending to the rear to define a substantially open rear portion, and a latching mechanism coupled to the base plate. The front portion is connected to the device. The base plate is configured to be at least partially inserted into the wall box. The latching mechanism includes a frictional engagement member configured to frictionally engage with the wall box upon insertion into the wall box.

18 Claims, 9 Drawing Sheets

U.S. PATENT DOCUMENTS

| | | | |
|---|---|---|---|
| D451,529 S | 12/2001 | Vasquez | |
| 6,369,322 B1 | 4/2002 | Gretz | |
| D457,502 S | 5/2002 | Sykes et al. | |
| D464,328 S | 10/2002 | Vasquez et al. | |
| D464,948 S | 10/2002 | Vasquez et al. | |
| 6,653,566 B2 | 11/2003 | Petak et al. | |
| D494,176 S | 8/2004 | Porter et al. | |
| D494,182 S | 8/2004 | Singer et al. | |
| D502,466 S | 3/2005 | Aupperle | |
| D505,676 S | 5/2005 | Porter et al. | |
| 6,956,169 B1 | 10/2005 | Shotey et al. | |
| D520,495 S | 5/2006 | Dukerschein et al. | |
| 7,038,132 B1 | 5/2006 | Lowe et al. | |
| 7,129,412 B2 | 10/2006 | Pierce | |
| D537,417 S | 2/2007 | Dukerschein et al. | |
| 7,179,996 B1 | 2/2007 | Britt et al. | |
| 7,183,487 B1 * | 2/2007 | O'Young et al. | 174/66 |
| 7,230,182 B1 | 6/2007 | Gates | |
| 7,247,794 B1 | 7/2007 | Johnson et al. | |
| D549,710 S | 8/2007 | Hynecek et al. | |
| 7,265,290 B1 * | 9/2007 | Hsu et al. | 174/66 |
| 7,396,997 B2 * | 7/2008 | Dinh | 174/67 |
| 7,427,714 B1 * | 9/2008 | Lammens et al. | 174/66 |
| RE40,600 E * | 12/2008 | Maltby et al. | 174/66 |
| 2007/0054651 A1 | 3/2007 | Farmer et al. | |

OTHER PUBLICATIONS

U.S. Appl. No. 29/184,318, filed Sep. 5, 2007, Rashid Skaf.
U.S. Appl. No. 29/284,319, filed Sep. 5, 2007, Rashid Skaf.
U.S. Appl. No. 29/284,321, filed Sep. 5, 2007, Rashid Skaf.
U.S. Appl. No. 29/284,322, filed Sep. 5, 2007, Rashid Skaf.
U.S. Appl. No. 29/284,323, filed Sep. 5, 2007, Rashid Skaf.
U.S. Appl. No. 60/715,330, filed Feb. 9, 2007, Farmer et al.
U.S. Appl. No. 11/673,285, filed Feb. 9, 2007, Phong Le.

* cited by examiner

WALL BOX MOUNTING APPARATUS

CROSS REFERENCE TO RELATED APPLICATIONS

The present application is a continuation of U.S. patent application Ser. No. 11/673,285, entitled "WALL BOX MOUNTING APPARATUS," filed in the U.S. Patent and Trademark Office on Feb. 9, 2007 now U.S. Pat. No. 7,414,193, hereby incorporated by reference, having a common inventor as the present document.

BACKGROUND OF THE INVENTION

1. Field of the Invention

This invention is related in general to the field of wall box mountings. More particularly, the invention is related to magnetic and/or friction wall box mountings of devices.

2. Discussion of the Background

A wall box is typically mounted on a wood beam during the construction of a home or office and is usually used to house a light switch and its associated wires and/or circuitry. Wall boxes today generally suffer from various disadvantages related to mounting. For instance, problems can arise if the wall box is skewed in any way after it has been mounted. In such a situation, the resulting light switch, light switch plate, or other device positioned in the wall box will appear to be similarly skewed resulting in an unaesthetic appearance. Additionally, if the depth of the wall box mounting in the wall is too deep, the supplied screws may be too short to affix the light switch, light switch plate, or other device to the wall box. Further, if the mounted wall box is not parallel to the wall's surface, the mounting screws can become cross threaded, because the screw is not received perpendicularly in a receiving nut or tapped hole, leading to eventual failure of the mounting system. Problems may also arise in situations where a device, including, without limitation, an infrared receiver or an infrared plate, is positioned in a skewed manner in the wall box. For example, the performance of the device can be affected if any equipment in communication with the device cannot adequately communicate because the device is not mounted properly.

Thus, as noted above, there currently exist numerous deficiencies in wall box mountings that are known in the prior art.

SUMMARY OF THE INVENTION

Accordingly, one aspect of the present invention is to provide an apparatus for mounting a device in a wall box that includes a base plate formed by a front portion and a plurality of side portions extending to the rear to define a substantially open rear portion, and a latching mechanism coupled to the base plate. The front portion is connected to the device. The base plate is configured to be at least partially inserted into the wall box. The latching mechanism includes a frictional engagement member configured to frictionally engage with the wall box upon insertion into the wall box.

Another aspect of the present invention is to provide an apparatus for mounting a device in a wall box that includes a base plate formed by a front portion and a plurality of side portions extending to the rear to define a substantially open rear portion, and a latching mechanism coupled to the device. The front portion is connected to a device. The base plate is configured to be at least partially inserted into the wall box. The latching mechanism includes a frictional engagement member configured to frictionally engage with the wall box upon insertion into the wall box.

Yet another aspect of the present invention is to provide method for mounting a device in a wall box that includes connecting a base plate to the device, and coupling a latching mechanism to the base plate by frictional engagement. The base plate is formed by a front portion and a plurality of side portions extending to the rear to define a substantially open rear portion. The front portion is connected to the device. The base plate is configured to be at least partially inserted into a wall box. The latching mechanism includes a frictional engagement member configured to frictionally engage with the wall box upon insertion into the wall box.

BRIEF DESCRIPTION OF THE DRAWINGS

A more complete appreciation of the present invention and many of the attendant advantages thereof will be readily obtained as the same becomes better understood by reference to the following detailed description when considered in conjunction with the accompanying drawings, wherein.

DETAILED DESCRIPTION OF THE PREFERRED EMBODIMENTS

Figure 1:
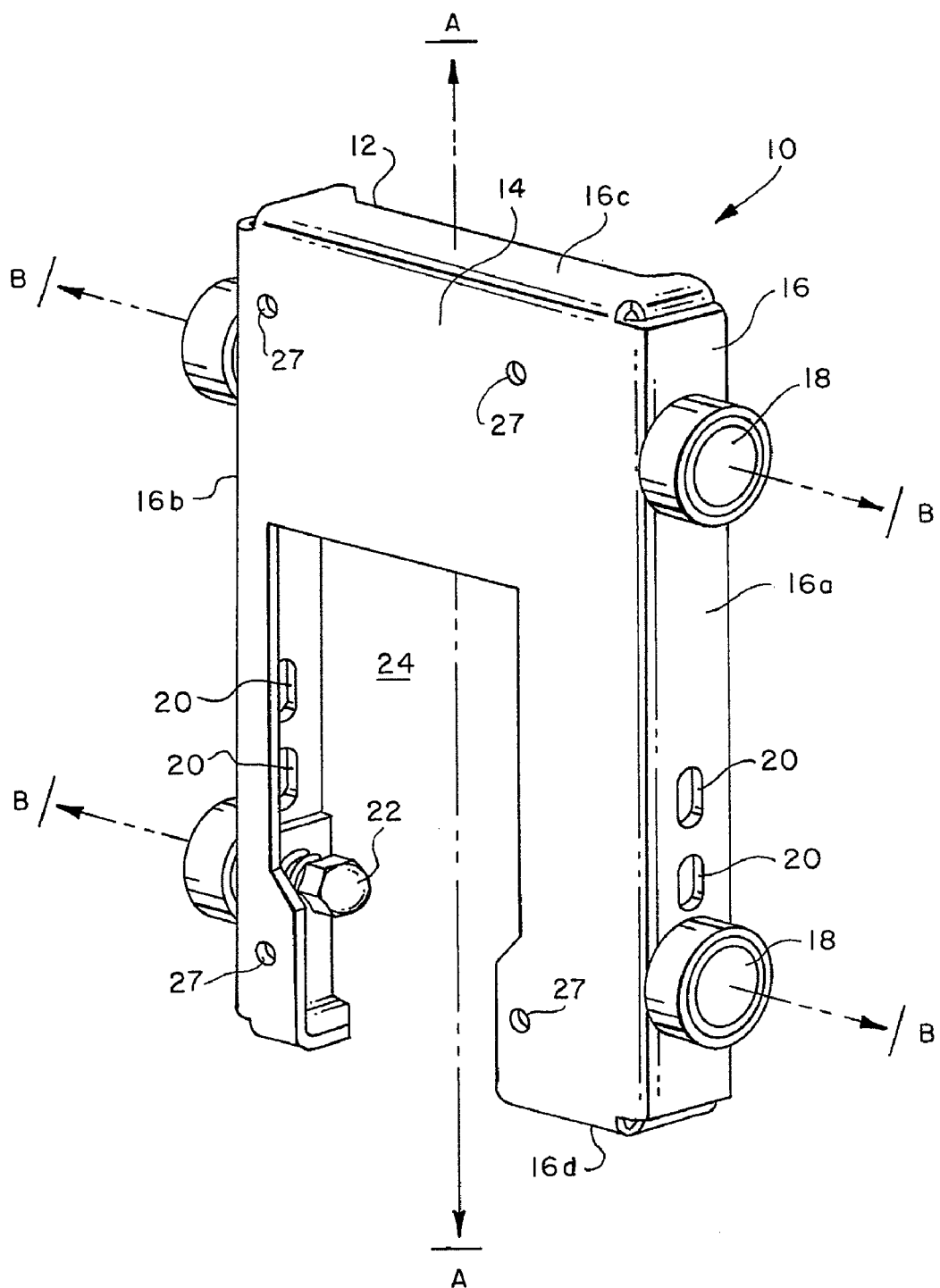
FIG. 1 is a front view of a base plate according to an embodiment of the present invention.

Referring now to the drawings, wherein like reference numerals designate identical or corresponding parts throughout the several views, preferred embodiments of the present invention are described.

Referring now to FIG. 1, a front view of a base plate 10 according to an embodiment of the present invention is shown. The base plate 10 generally has a rectangular configuration defined by a front portion 14 and side portions 16 (16a, 16b, 16c and 16d) extending to the rear to define a substantially open rear portion 12. The front portion 14 extends along a center axis (A). The front portion 14 is operably configured to be coupled to a device 28, and secured within a magnetically engageable wall box 40 by, at least in part, means of a magnetic force between the base plate 10 and the magnetically engageable wall box 40. The coupling between the front portion 14 and the device 28 may be by any means known in the art, including, without limitation, a screw, a bolt, a pin, a clip, an adhesive, a solder, or the like. For example, the front portion 14 may be fixedly mounted to the device 28 via screws (not shown) protruding through one or more screw holes 27. Alternatively, one or more components of the base plate 10 may be formed as a portion of the device 28 itself. Additionally, more than one device 28 may be coupled to one or more base plates 10 which may be operably secured within the magnetically engageable wall box 40.

The front portion 14, the side portions 16 and the rear portion 12 may be configured as separate components, or any combination thereof may be formed as portions of a unitary body. Side portions 16 may also include one or more openings 20, such as holes or perforations, operable to accommodate tie-wraps or other objects to assist in securing wires, cables, or other elements attached to or positioned near a device 28. Obviously, side portions 16 may include any number of openings 20 without departing from the scope of the present invention. It is also to be understood that the present invention is not limited to the above identified connecting components and that other connecting components may be used within the scope of the present invention. Each of the base plate 10 components may be made from any material, including, without limitation, metal, plastic, composite materials, or the like. In one configuration, the components of the base plate 10 are made from metal from pressure casting or stamping.

One or more magnets 18 may be coupled to one or more of the side portions 16. Such coupling between each magnet 18 and its respective side portion 16 may be fixed or displaceable. The fixed coupling may be by any means known in art, including, without limitation, a screw, a bolt, a pin, a clip, an adhesive, a solder, or the like. The displaceable coupling may be by any means known in art, including, without limitation, a pin, a retractor, a spring, a hinge, a living hinge, a rivet, a screw, a bolt, or any combination thereof, or the like. Such displaceable coupling may also be by means of an elastically deflectable portion of the side portions 16.

Figure 2:
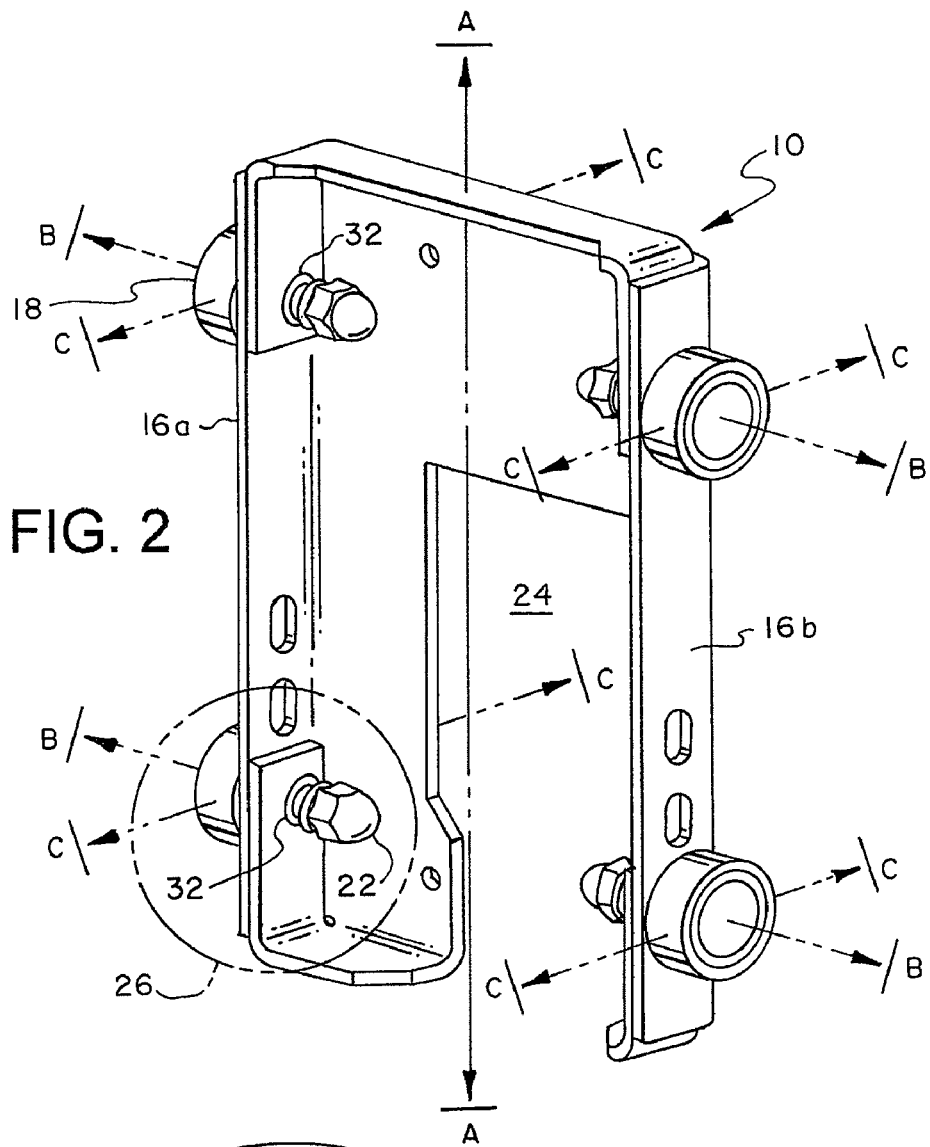
FIG. 2 is a rear view of the base plate according to an embodiment of the present invention.
Figure 10:
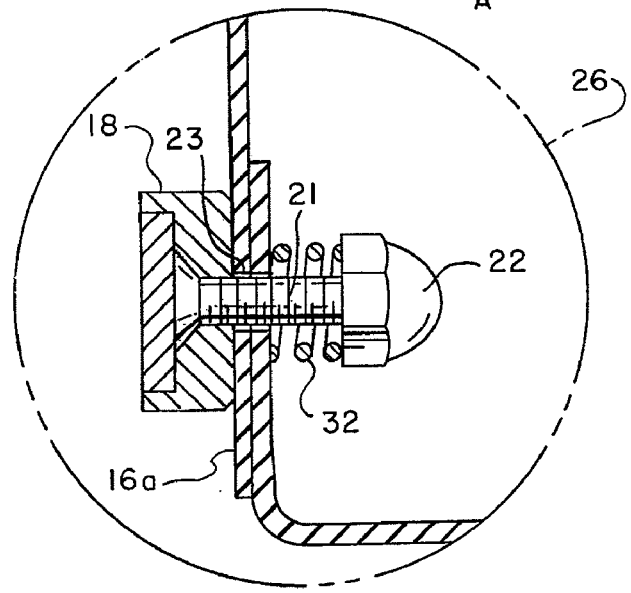
FIG. 10 is a cutaway section of the base plate according to an embodiment of the present invention.
Figure 11:
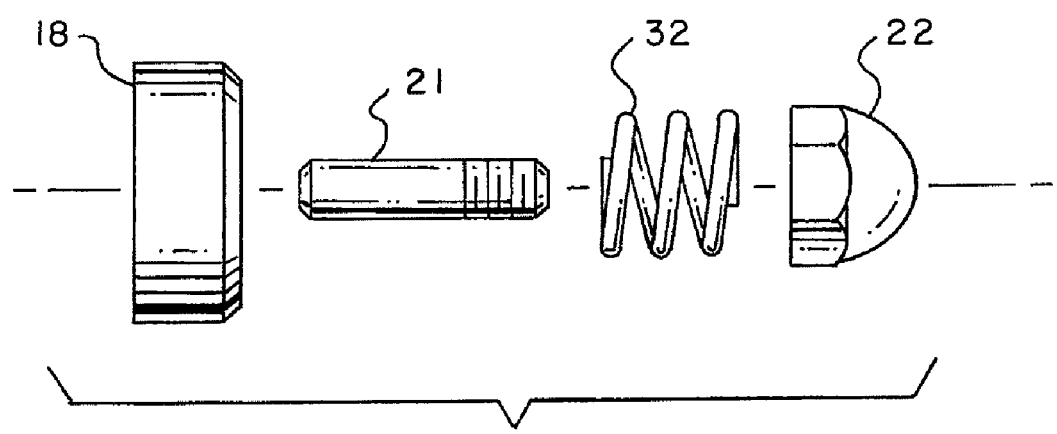
FIG. 11 is an exploded view of the cutaway section shown in FIG. 10 according to an embodiment of the present invention.
Figure 14:
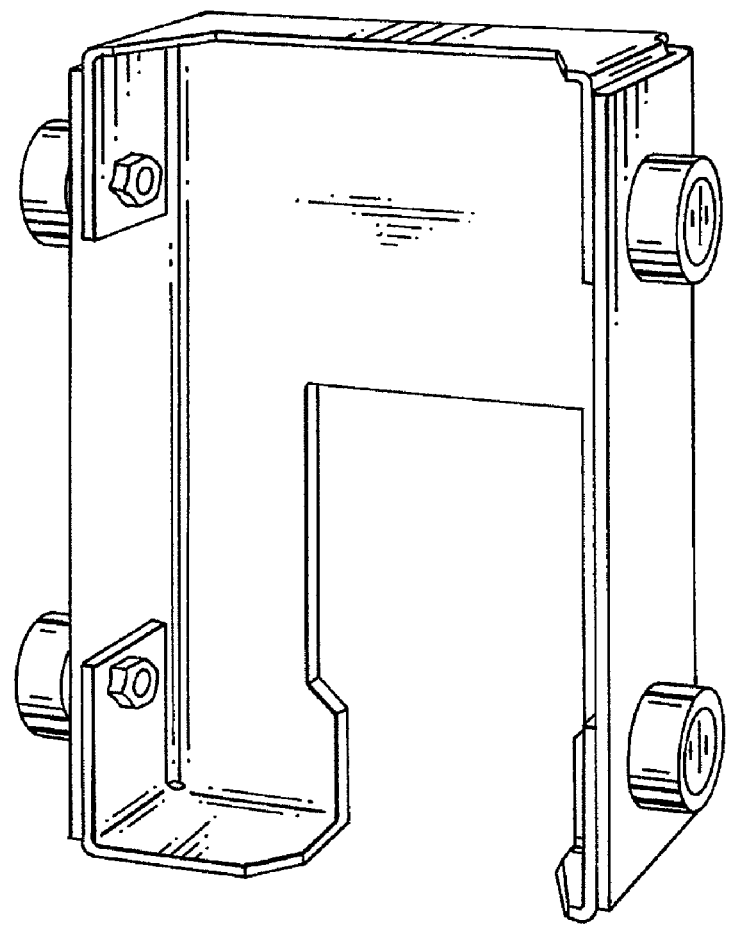
FIG. 14 is a rear view of the base plate according to an alternate embodiment of the present invention.
Figure 15:
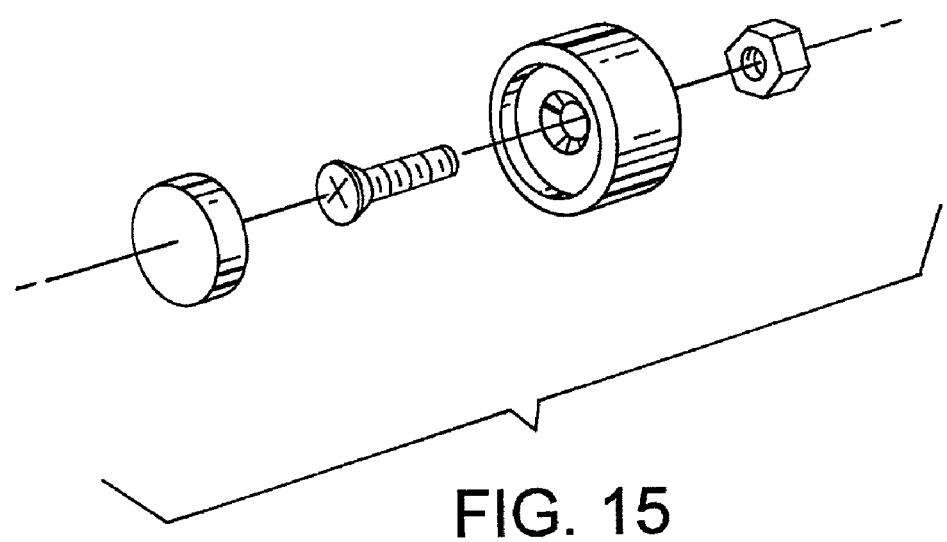
FIG. 15 is an exploded view of the cutaway section shown in FIG. 10 according to an alternate embodiment of the present invention.

In one arrangement, as shown in FIGS. 2, 10 and 11, each magnet 18 is adjustably coupled to its respective side portion 16 by a retractor pin 22 inserted through openings 23 in the side portion 16. The adjustable coupling may also include a spring 32 connected to the retractor pin 22 and configured to provide retractable resistance thereto, such that each magnet 18 is at least initially retracted towards its respective side portion 16. However, it is to be understood that a spring is not required within the scope of the present invention. In an alternate arrangement, as shown in FIGS. 14 and 15, each magnet 18 is fixedly coupled to its respective elastically deflectable side portion 16 by a screw, bolt or the like inserted through openings 23 in the elastically deflectable side portion 16.

Figure 3:
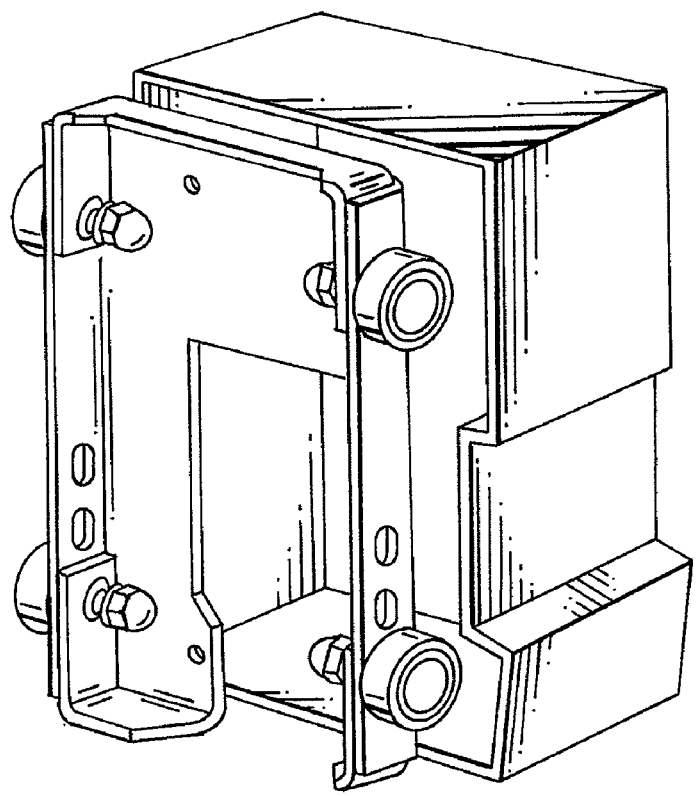
FIG. 3 is an exploded rear view of the base plate coupled to a device according to an embodiment of the present invention.
Figure 7:
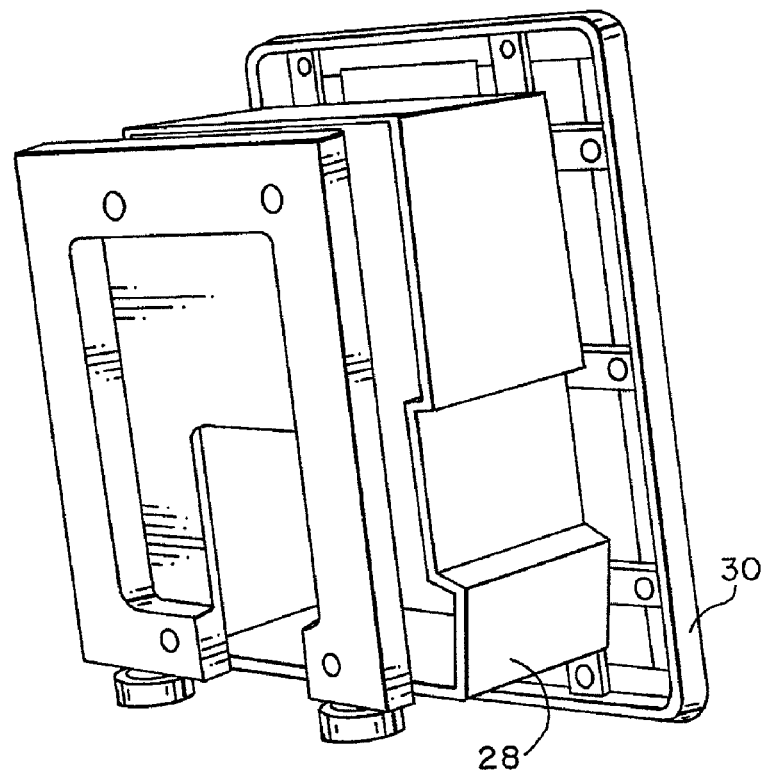
FIG. 7 is a side view of the base plate coupled to the device according to an alternate embodiment of the present invention.
Figure 4:
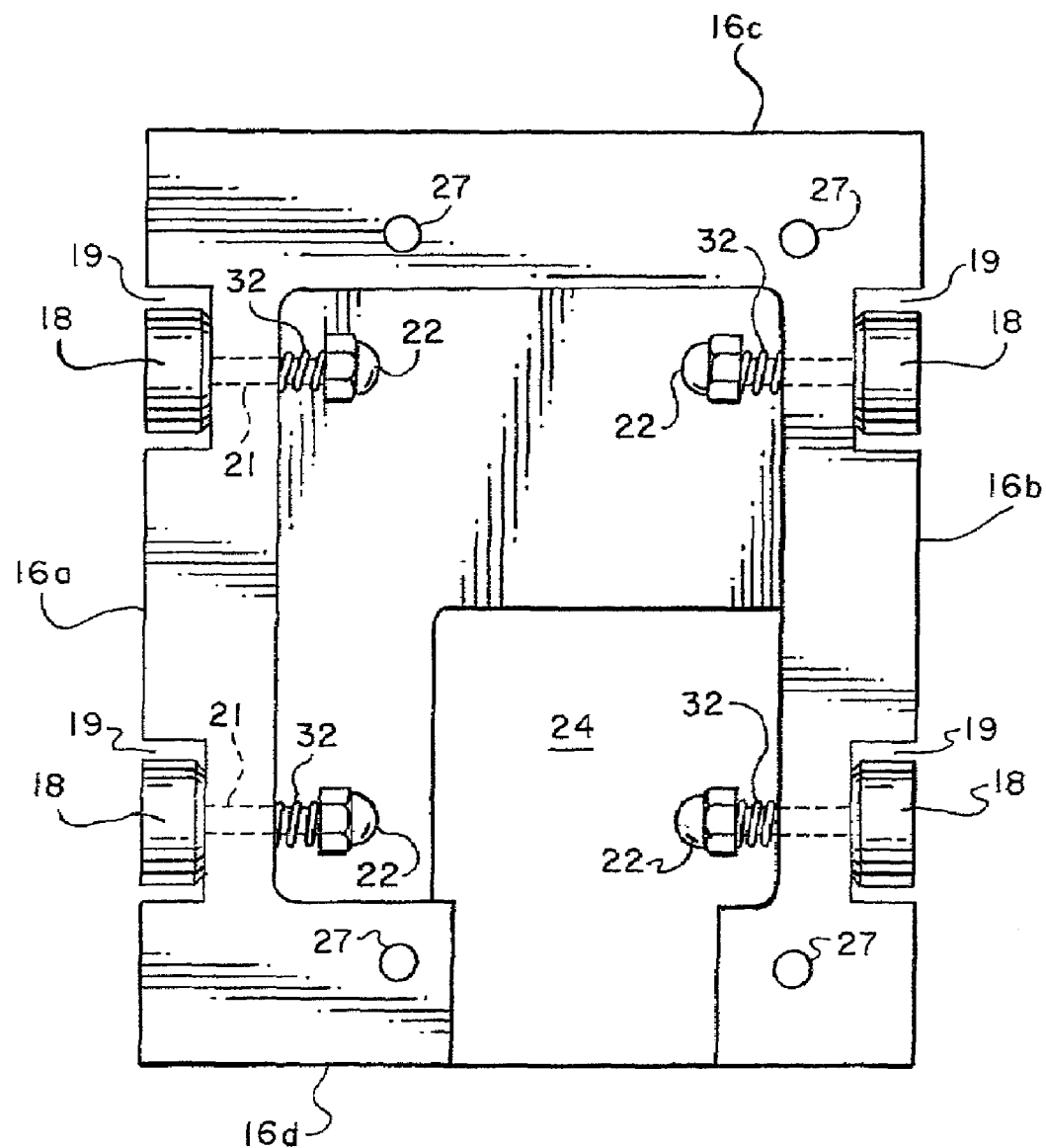
FIG. 4 is a rear view of the base plate according to an embodiment of the present invention.

As shown in FIG. 4, the side portions 16 may also include recesses 19 that are larger than the diameter of the magnets 18, such that at least a portion of each magnet 18 may be retracted interior to the outer surface of its respective side portion 16. As shown in FIGS. 1-6, the magnets 18 may be adjustably coupled to side portions 16a and 16b, operatively allowing movement in a direction (B) that is transverse to the center axis (A), such that the magnets move in an outward direction away from the base plate 10 and towards a magnetically engageable wall box 40. Alternatively, as shown in FIG. 7, the magnets 18 may also be adjustably coupled to side portions 16c and 16d, operatively allowing movement in a direction along the center axis (A). It is to be understood that any number of magnets 18 may be coupled to any one or more of the side walls 16, the front portion 14, the rear portion 12, or any combination thereof within the scope of the present invention. Thereby, a device 28 coupled to the base plate 10 may be easily aligned and/or adjusted in a proper orientation with respect to the magnetically engageable wall box 40 and the wall.

Figure 9:
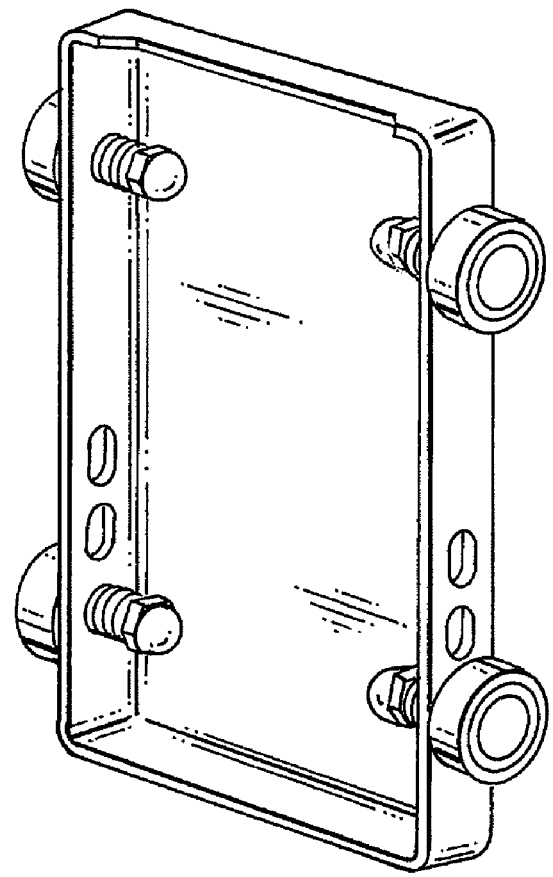
FIG. 9 is a rear view of the base plate according to an alternate embodiment of the present invention.

The front portion 14 and/or one or more of the side portions 16 may include a cut-out portion 24 operable to accommodate elements attached to or positioned near the device, to assist in the dissipation of heat from the device 28 and/or to accommodate wires or other cabling. However, it is to be understood that the front portion 14 and/or one or more of the side portions 16 may also be configured without cut-out portion 24, as shown in FIG. 9.

Figure 8:
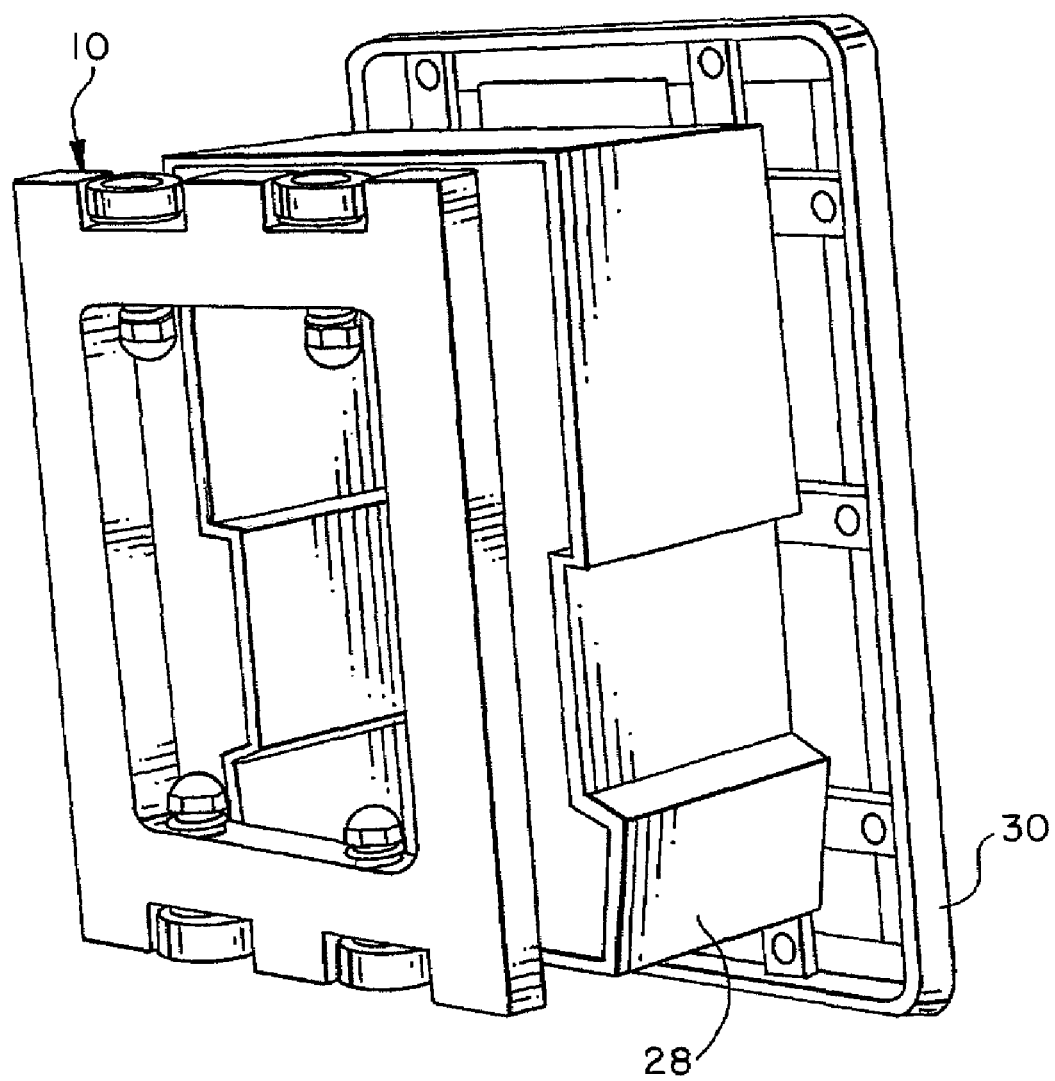
FIG. 8 is a side view of the base plate coupled to the device according to an alternate embodiment of the present invention.

Although shown in FIG. 1 as having a rectangular shape, the base plate 10 may also be arranged in a variety of shapes, including, without limitation, a square, a rectangular, a octagonal, an oval, and a circular shape, or the like within the scope of the invention. Likewise, the cut-out portion may be arranged in a variety of shapes. The base plate 10 and the cut-out portion 24 may also be arranged in a variety of thicknesses and sizes. Additionally, any number of magnets 18 of various shapes, thicknesses, and sizes may be arranged on any portion of the base plate 10 in various locations without departing from the scope of the present invention. For example, as shown in FIGS. 7 and 8, the magnets may be arranged, respectively, on the rear portion 12 or any of the side portions 16. Alternatively, one or more of the magnets 18 may be replaced with magnetized portions of the base plate 10 itself. For instance, one or more of the side portions 16 may be magnetized. In this configuration, the side portions 16 may be operatively configured to be adjustable in an outward direction (A and/or B) away from the base plate 10 and towards a magnetically engageable wall box 40. In one possible arrangement, the side portions 16 are adjustably coupled to the front portion 14 using any means known in the art. In another configuration, the rear portion 12 is magnetized. In this configuration, the rear portion 12 may be operatively configured to be adjustable in a direction (C) that is longitudinal to the center axis (A), such that the rear portion 12 is adjustable in an outward direction (C) away from the base plate 10 and towards a magnetically engageable wall box 40. The rear portion 12 may be adjustably coupled to the side portions 16 using any means known in the art.

Referring now to FIG. 2, a rear view of the base plate 10 according to an embodiment of the present invention is shown. As shown at cutaway section 26 in FIG. 2, and, in particular, FIG. 10, side portions 16c and 16d may be extended to overlap neighboring side portions 16a and 16b. Obviously, other overlap configurations are possible without departing from the scope of the present invention. Such overlap, as shown in cutaway section 26, may operably be provided such that retractors 22 are more securely coupled to the side portions 16.

As previously discussed, one or more of the side portions 16 may be a unitary extension of the front portion 14 formed to the shape shown in FIG. 2 by any means known in the art, including, without limitation, molding, pressure casting, stamping, or the like. For example, FIG. 9 depicts one possible alternate arrangement in which the side portions 16 are a unitary extension of the front portion 14.

Referring now to FIG. 4, a side view of the base plate 10 coupled to a device 28 according to an embodiment of the present invention is shown. The device 28 may or may not be configured to be coupled to a switch plate 30 facing or the like. In one possible configuration, the device 28 houses a circuit (not shown) that operably provides a communication functionality, including, without limitation, transferring audio or video signals, operating a light source, operating a thermostat, or operating other types of devices. In another configuration, the device 28 itself is the circuit. The device may also be coupled to, without limitation, a switch plate, a light switch, an infrared receiver, an infrared transmitter, an audio control, a light source, a thermostat, a video control, a multi-media control, a wireless transmitter, an electronic device or the like. The base plate 10 and the device 28 may be further configured to be secured within a magnetic wall box 40, such that the base plate 10 and the device 28 (and including any attached switch plate facing or other coupling) is flush with the wall surface.

Referring now to FIG. 4, a side view of the base plate 10 coupled to the device 28 according to an embodiment of the present invention is shown. Obviously, the overall dimensions of the base plate 10 and the device 28, including, without limitation, the size, shape, and thickness thereof, may be altered within the scope of the present invention as long as the base plate 10 and the device 28 are able to fit within the magnetically engageable wall box 40.

Figure 5:
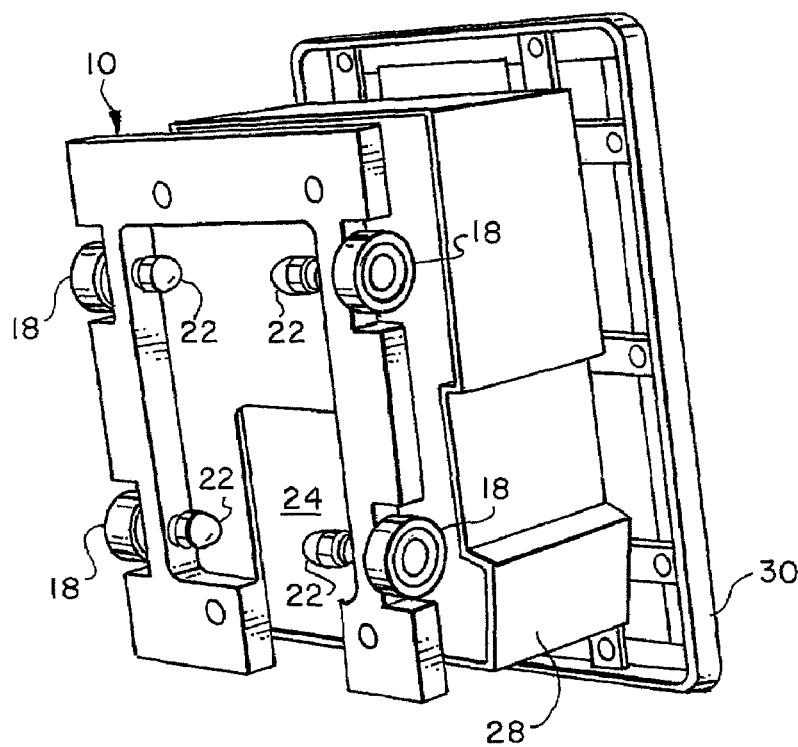
FIG. 5 is a side view of the base plate coupled to the device according to an embodiment of the present invention.
Figure 6:
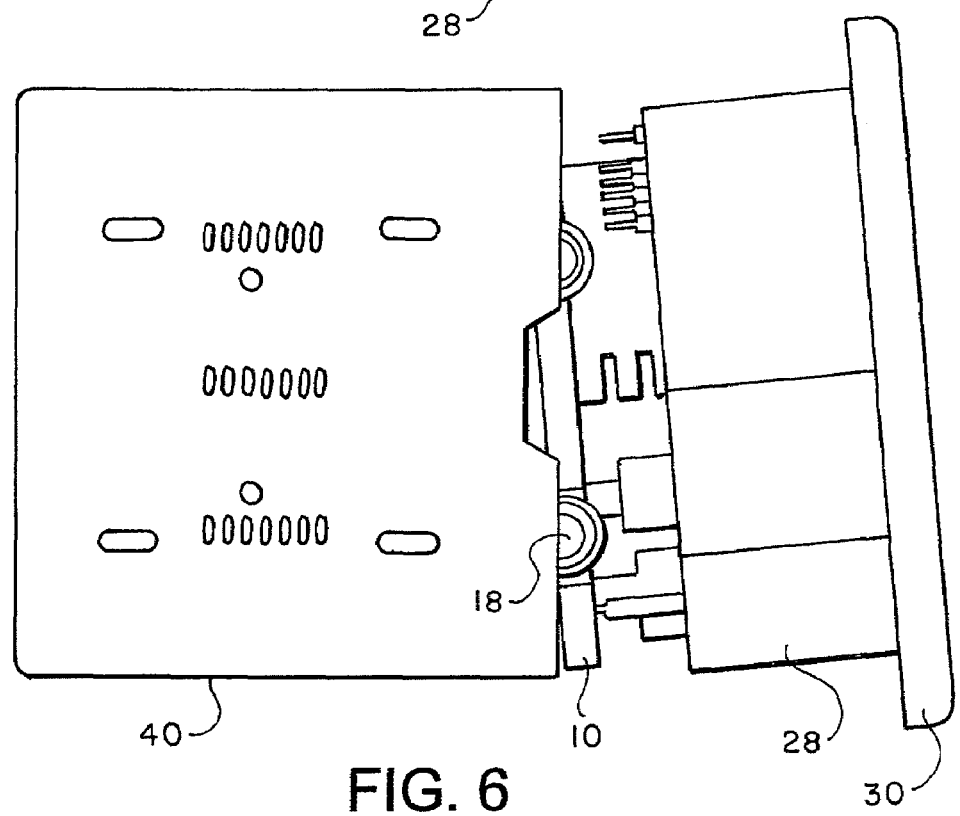
FIG. 6 is a top view of the base plate coupled to a device partially inserted into a magnetically engageable wall box according to an embodiment of the present invention.

Referring to FIGS. 3 and 5, an exploded rear view and top view, respectively, of the base plate 10 coupled to a device 28 according to an embodiment of the present invention are shown. FIG. 6 further shows the base plate 10 and the device 28 partially inserted into a magnetically engageable wall box 40 according to an embodiment of the present invention. As the base plate 10 is inserted, the magnets 18 engage the inside walls of the magnetically engageable wall box 40. No mounting screws are required to properly position the switch plate 30 in relation to a wall even if the magnetically engageable wall box 40 is not properly mounted. The magnetic force exerted by the magnets 18 is configured such that the base plate 10 and the coupled device 28 (and including any attached switch plate, facing, or other coupling) may be adjusted after insertion into the magnetically engageable wall box 40. Further, the magnetic force exerted by the magnets 18 and/or frictional engagement may be configured such that it prevents small children from removing the switch plate 30. Alternatively, at least a portion of the interior of the magnetically engageable wall box 40 is magnetized instead of, or in combination with, the magnets 18.

In one embodiment, a base plate 10 includes at least one magnet 18 and at least one spring 32 coupled to the magnet 18. The magnet 18 is configured to allow movement in an outward direction (A, B or C) away from the base plate 10 when the base plate 10 is placed in a magnetically engageable wall box 40. The base plate 10 moves proportionally to a tension of the spring 32. The base plate 10 is coupled to a device 28, such as a circuit, to provide various functionality. The functionality may include, without limitation, receiving audio signals, processing audio signals, transferring audio signals, receiving video signals, processing video signals, transferring video signals, operating a light source, operating a thermostat, operating an electronic device and operating a mechanical device. The device 28 of the base plate 10 may be coupled to a switch plate operable to control the device 28. The magnets 18 are operable to align the device 28 in the magnetically engageable wall box 40, and to align the switch plate in proximity to the magnetically engageable wall box 40. The base plate 10 may also include a cut-out portion.

Figure 12A:
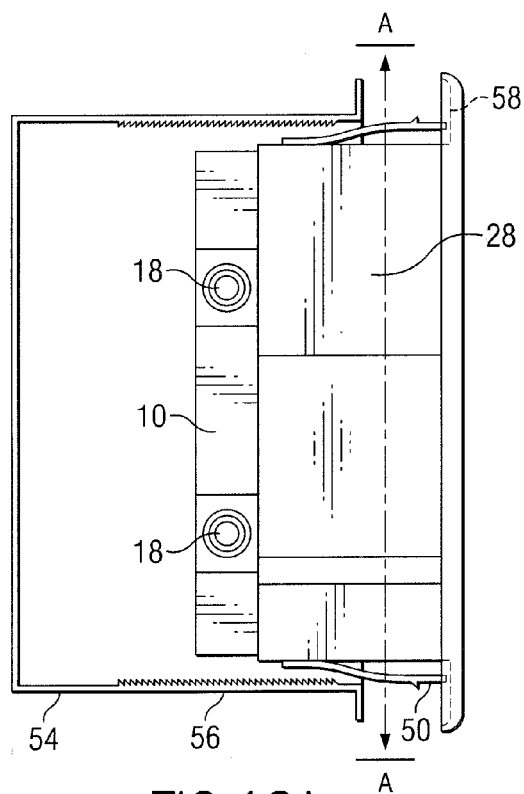
FIG. 12 is a top view of a latching mechanism coupled to a device partially inserted into a wall box according to an alternate embodiment of the present invention.
Figure 12B:
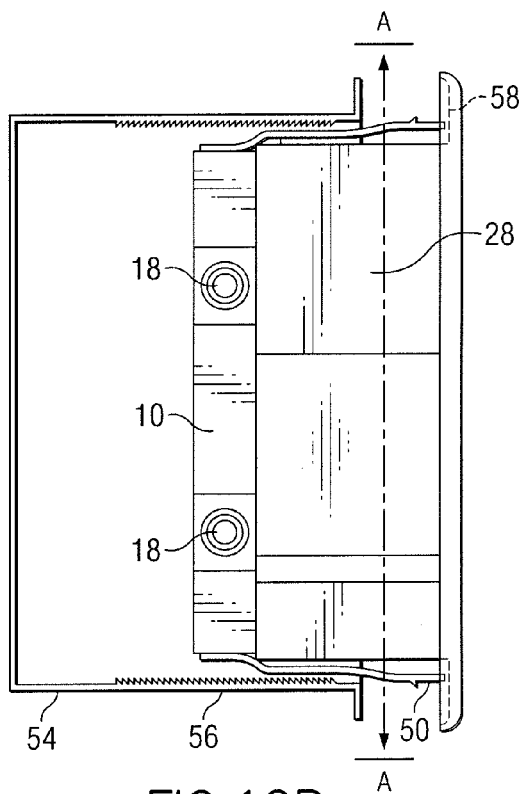

Referring now to FIG. 12, a top view of a latching mechanism 50 coupled to a device 28 partially inserted into a wall box 54 according to an alternate embodiment of the present invention is shown. The latching mechanism 50 includes one or more ridge 60 (or tooth) operatively configured upon insertion to detachably engage one or more corresponding ridge 56 (or tooth) on at least one interior surface of the wall box 54. In one configuration, the latching mechanism 50 is coupled to an exterior surface of the device 28. Alternatively, the latching mechanism 50 may be coupled to an exterior surface of the base plate 10. When the device 28 is inserted into the wall box 54, the latching mechanism 50 elastically deflects in a direction (A) toward the device 28, and the ridge 60 of the latching mechanism 50 catches and rests against a ridge 56 of the interior surface of the wall box 54. As such, the device 28 is firmly positioned within the wall box 54. If the device 28 is to be removed from the wall box 54, or repositioned within the wall box 54, the latching mechanism 50 may be depressed in a direction (A), such that the ridge 60 from the mechanism 50 releases an engaged ridge 56. The latching mechanism 50 may move back and forth in a direction (A) such that the latching mechanism 50 is retracted when being placed in the wall box 54 or refracted when being removed from the wall box 54. Obviously, the number, sizes, shapes and locations of the latching mechanism 50 or the ridges 56 may differ without departing from the scope of the present invention. Also, the wall box 54 may be of various sizes and shapes and may be magnetized or non-magnetized within the scope of the present invention. For example, as shown in FIG. 12, the base plate 10 includes the magnets 18 and is connected to the device 28 such that base plate 10 and the device 28 are secured in the wall box 54 by both magnetic and frictional engagement. The magnetic engagement operates as discussed above with respect to FIGS. 1-11.

Figure 13:
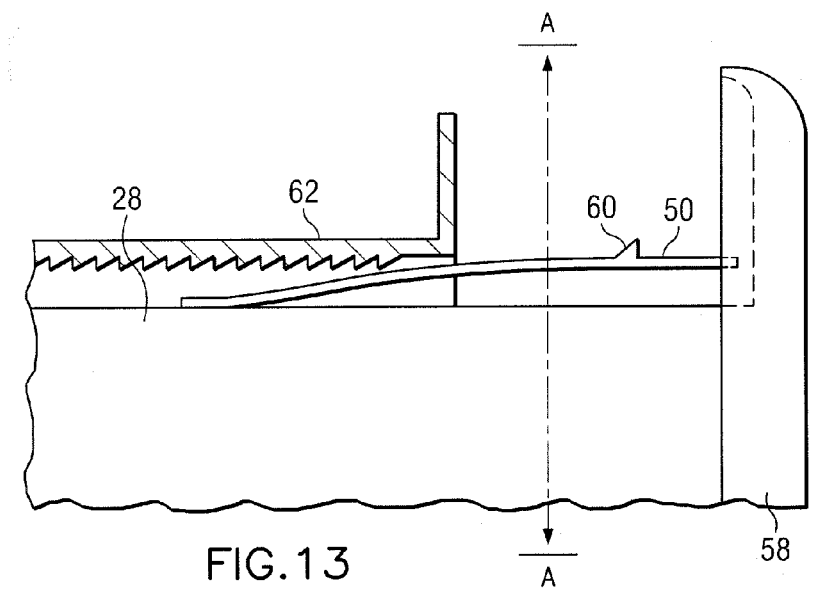
FIG. 13 is a side view of the latching mechanism according to an alternate embodiment of the present invention.

Referring now to FIG. 13, a side view of the latching mechanism 50 according to an alternate embodiment of the present invention is shown. In this configuration, the device 28 is secured to a wall box 54 by means of frictional engagement Specifically, when the device 28 is inserted into the wall box 54, at least one ridge 60 (or tooth) catches and rests against one of a series of ridges 56 (or teeth) on an interior portion 62 of the wall box 54. Obviously, the number, sizes, shapes and locations of the ridge or tooth 60 can differ within the scope of the present invention. Further, an alternate object, such as one that is more bulbous, may be used instead of the ridge or tooth 60 and may be placed in a slot attached to, or a part of, the interior portion 62 (instead of the series of ridges or teeth 56).

Although an exemplary embodiment of the system of the present invention has been illustrated in the accompanied drawings and described in the foregoing detailed description, it will be understood that the invention is not limited to the embodiments disclosed, but is capable of numerous rearrangements, modifications, and substitutions without departing from the spirit of the invention as set forth and defined by the following claims. For example, the capabilities of the invention can be performed fully and/or partially by a single component or multiple components. Also, these capabilities may be performed in the current manner or in a distributed manner and on any device able to provide and/or receive information. Further, although depicted in a particular manner, various modules or blocks may be repositioned without departing from the scope of the present invention. For example, the device 28 and/or the switch plate 30 may include magnets or be magnetized. Still further, although depicted in a particular manner, any number of modules and connections can be utilized with the present invention in order to accomplish the present invention, to provide additional known features to the present invention and/or to make the present invention more efficient. For example, in situations where a non-magnetic wall box is used, springs may be manually adjusted to ensure that when one or more magnets are placed the non-magnetic wall box, the force exerted by the magnets against a non-magnetic surface of the wall box is sufficient to hold the base plate 10, the device 28, and the switch plate 30, securely in place within the wall box. Also, information sent between various modules (including the device 28 and the switch plate 30), may be transmitted between the modules via a wireless source, a wired source and/or a plurality of protocols.

Obviously, many other modifications and variations of the present invention are possible in light of the above teachings. The specific embodiments discussed herein are merely illustrative, and are not meant to limit the scope of the present invention in any manner. It is therefore to be understood that within the scope of the disclosed concept, the invention may be practiced otherwise than as specifically described.

The invention claimed is:

1. An apparatus for mounting a device in a wall box, comprising:
    a base plate formed by a front portion and a plurality of side portions extending to the rear to define a substantially open rear portion, wherein the front portion is connected to the device, and wherein the base plate is configured to be at least partially inserted into the wall box; and a latching mechanism coupled to the base plate, wherein the latching mechanism includes a frictional engagement member configured to frictionally engage with the wall box upon insertion into the wall box, wherein the latching mechanism includes one or more ridges that elastically deflect to catch and rest against corresponding one or more ridges of the wall box upon insertion into the wall box.

2. The apparatus of claim 1, wherein the latching mechanism is configured to engage and disengage with the wall box by elastic deflection of the latching mechanism.

3. The apparatus claim 1, wherein the latching mechanism is coupled to an exterior surface of the base plate.

4. The apparatus claim 1, further comprising at least one magnet, the at least one magnet being connected to an interior wall of the wall box, wherein the at least one magnet is operably configured to magnetically engage the base plate.

5. The apparatus of claim 4, wherein the base plate includes a plurality of side walls, and wherein at least one of the plurality of side portions comprises an elastically deflectable portion configured to permit the at least one of the plurality of side portions to move in an outward direction relative to one of the plurality of side walls when the at least one magnet engages the base plate.

6. The apparatus of claim 1, further comprising at least one magnet, the at least one magnet being connected to the base plate, wherein the at least one magnet is operably configured to magnetically engage the wall box.

7. The apparatus of claim 6, wherein the base plate includes a plurality of side walls, and wherein at least one of the plurality of side portions comprises an elastically deflectable portion configured to permit the at least one of the plurality of side portions to move in an outward direction relative to one of the plurality of side walls when the at least one magnet engages the wall box.

8. The apparatus of claim 1, wherein the one or more ridges of the latching mechanism comprises one or more bulbous portions and the one or more ridges of the wall box comprises one or more slots.

9. An apparatus for mounting a device in a wall box, comprising:
    a base plate formed by a front portion and a plurality of side portions extending to the rear to define a substantially open rear portion, wherein the front portion is connected to a device, and wherein the base plate is configured to be at least partially inserted into the wall box; and a latching mechanism coupled to the device, wherein the latching mechanism includes a frictional engagement member configured to frictionally engage with the wall box upon insertion into the wall box, wherein the latching mechanism includes one or more ridges that elastically deflect to catch and rest against corresponding one or more ridges of the wall box upon insertion into the wall box.

10. The apparatus of claim 9, wherein the latching mechanism is configured to engage and disengage with the wall box by elastic deflection of the latching mechanism.

11. The apparatus of claim 9, wherein the latching mechanism is coupled to an exterior surface of the device.

12. The apparatus of claim 9, further comprising at least one magnet, the at least one magnet being connected to an interior wall of the wall box, wherein the at least one magnet is operably configured to magnetically engage the base plate.

13. The apparatus of claim 12, wherein the base plate includes a plurality of side walls, and wherein at least one of the plurality of side portions comprises an elastically deflectable portion configured to permit the at least one of the plurality of side portions to move in an outward direction relative to one of the plurality of side walls when the at least one magnet engages the base plate.

14. The apparatus of claim 9, further comprising at least one magnet, the at least one magnet being connected to the base plate, wherein the at least one magnet is operably configured to magnetically engage the wall box.

15. The apparatus of claim 14, wherein the base plate includes a plurality of side walls, and wherein at least one of the plurality of side portions comprises an elastically deflectable portion configured to permit the at least one of the plurality of side portions to move in an outward direction relative to one of the plurality of side walls when the at least one magnet engages the wall box.

16. The apparatus of claim 9, wherein the one or more ridges of the latching mechanism comprises one or more bulbous portions and the one or more ridges of the wall box comprises one or more slots.

17. A method for mounting a device in a wall box, comprising:
    connecting a base plate to the device, the base plate being formed by a front portion and a plurality of side portions extending to a rear to define a substantially open rear portion, wherein the front portion is connected to the device, and wherein the base plate is configured to be at least partially inserted into a wall box; and coupling a latching mechanism to the base plate by frictional engagement, wherein the latching mechanism includes a frictional engagement member configured to frictionally engage with the wall box upon insertion into the wall box, and wherein the latching mechanism includes one or more ridges that elastically deflect to catch and rest against corresponding one or more ridges of the wall box upon insertion into the wall box.

18. The method of claim 17, further comprising magnetically engaging the base plate using at least one magnet connected to an interior wall of the wall box.

* * * * *